(12) United States Patent
Lu et al.

(10) Patent No.: US 11,283,358 B2
(45) Date of Patent: Mar. 22, 2022

(54) CONTROLLER FOR A MULTI-PHASE CONVERTER AND FAULT DETECTION METHOD THEREOF

(71) Applicant: Chengdu Monolithic Power Systems Co., Ltd., Chengdu (CN)

(72) Inventors: Wenbin Lu, Hangzhou (CN); Wangmiao Hu, Hangzhou (CN); Lijie Jiang, Hangzhou (CN)

(73) Assignee: Chengdu Monolithic Power Systems Co., Ltd., Chengdu (CN)

( * ) Notice: Subject to any disclaimer, the term of this patent is extended or adjusted under 35 U.S.C. 154(b) by 162 days.

(21) Appl. No.: 16/905,389

(22) Filed: Jun. 18, 2020

(65) Prior Publication Data
US 2020/0403495 A1    Dec. 24, 2020

(30) Foreign Application Priority Data
Jun. 21, 2019    (CN) .......................... 201910541437.9

(51) Int. Cl.
| | | |
|---|---|---|
| *H02M 3/158* | (2006.01) | |
| *H02M 1/32* | (2007.01) | |
| *H02M 1/44* | (2007.01) | |
| *H03K 19/20* | (2006.01) | |
| *H02M 3/156* | (2006.01) | |
| *H02M 1/00* | (2006.01) | |

(52) U.S. Cl.
CPC .......... *H02M 3/1584* (2013.01); *H02M 1/32* (2013.01); *H02M 1/44* (2013.01); *H02M 3/1563* (2013.01); *H02M 3/1586* (2021.05); *H03K 19/20* (2013.01); *H02M 1/0009* (2021.05); *H02M 1/325* (2021.05)

(58) Field of Classification Search
CPC .... H02M 3/1584; H02M 3/1586; H02M 1/32; H02M 1/44; H02M 3/1563; H02M 1/0009; H02M 1/325
See application file for complete search history.

(56) References Cited

U.S. PATENT DOCUMENTS

| | | | |
|---|---|---|---|
| 9,071,142 B2 | 6/2015 | Yang et al. | |
| 9,270,178 B2 | 2/2016 | Jiang et al. | |
| 9,496,792 B2 | 11/2016 | Ouyang | |
| 2002/0125869 A1* | 9/2002 | Groom ................ | H02M 3/1584 323/283 |

(Continued)

*Primary Examiner* — Rafael O De Leon Domenech
(74) *Attorney, Agent, or Firm* — Perkins Coie LLP

(57) ABSTRACT

A fault detection method is sampling currents flowing through a plurality of switching circuits to generate a plurality of current sampling signals, generating a first reference signal and a second reference signal based on a predetermined reference signal and a ripple threshold signal, and generating a plurality of fault signals based on comparison results of each of the plurality of current sampling signals with the first reference signal and the second reference signal. When one of the plurality of current sampling signals is between the first reference signal and the second reference signal, a corresponding one of the plurality of fault signals changes to a first state, and when the corresponding one of the plurality of fault signals remains the first state for more than a predetermined time period, a corresponding one of control signals turns off a corresponding one of the plurality of switching circuits.

18 Claims, 14 Drawing Sheets

(56) References Cited

U.S. PATENT DOCUMENTS

| | | | | |
|---|---|---|---|---|
| 2011/0260703 A1* | 10/2011 | Laur | ................... | H02M 3/1563 |
| | | | | 323/271 |
| 2013/0002212 A1* | 1/2013 | Fan | ................... | H02M 3/1588 |
| | | | | 323/235 |
| 2014/0167833 A1* | 6/2014 | Jiang | ................... | H02M 3/157 |
| | | | | 327/365 |
| 2014/0375288 A1* | 12/2014 | Nora | ................... | H02J 1/102 |
| | | | | 323/272 |
| 2015/0091535 A1* | 4/2015 | Fan | ................... | H02M 3/1584 |
| | | | | 323/234 |
| 2016/0062375 A1* | 3/2016 | Houston | ................... | G05F 1/56 |
| | | | | 323/280 |
| 2019/0199209 A1* | 6/2019 | Shao | ................... | H02M 1/15 |

\* cited by examiner

CONTROLLER FOR A MULTI-PHASE CONVERTER AND FAULT DETECTION METHOD THEREOF

This application claims the benefit of CN application No. 201910541437.9, filed on Jun. 21, 2019, and incorporated herein by reference.

TECHNICAL FIELD

The present invention generally relates to electronic circuits, and more specifically but not exclusively to a controller for a multi-phase converter and fault detection method thereof.

BACKGROUND

In recent years, multi-phase converters having a plurality of switching circuits coupled in parallel have been widely used in high-performance CPU power supplies due to their superior performance. CPU-related circuits play a central role in an application system, so a high reliability of CPU power supply circuit is needed. During a working process of the multi-phase converter, how to monitor the aging or damage of the plurality of switching circuits accurately and skip a fault switching circuit as quickly as possible to allow the entire circuit to continue working increasingly becomes a technology issue.

A conventional method is applying a current-sharing loop. If a deviation between a current flowing through one of the plurality of switching circuits and an average current exceeds a threshold value predetermined by a register lasting for a time period, the corresponding switching circuit will be cut out, and a corresponding pulse width modulation (PWM) signal will be extended to the next switching circuit, the number of working switching circuits of the converter will be reduced by one. However, the conventional method will cause an uneven current for a short time period when a load is dynamic. In order to prevent misjudgment, it takes a long time period to judge, and in order to ensure that the switching circuit will not be cut out by mistake, the threshold value should be large, and a high accuracy is needed to detect the current flowing through the corresponding switching circuit. Misjudgment may occur if the accuracy is insufficient.

SUMMARY

It is one of the objects of the present invention to provide a controller for a multi-phase converter and fault detection method thereof.

One embodiment of the present invention discloses a controller for a multi-phase converter, wherein the multi-phase converter comprises a plurality of switching circuits coupled in parallel, the controller comprising: a current sampling circuit, configured to generate a plurality of current sampling signals, wherein each of the plurality of current sampling signals represents an associated current flowing through a corresponding one of the plurality of switching circuits; a filter circuit, configured to generate a plurality of filtering signals by filtering the plurality of current sampling signals; a reference voltage generation circuit, coupled to the filter circuit to receive the plurality of filtering signals, and configured to generate a plurality of first reference signals and a plurality of second reference signals based on the plurality of filtering signals and a ripple threshold signal, wherein each of the plurality of first reference signals is equal to a sum of a corresponding one of the plurality of filtering signals and the ripple threshold signal, each of the plurality of second reference signals is equal to a difference between the corresponding one of the plurality of filtering signals and the ripple threshold signal; a fault signal generation circuit, configured to generate a plurality of fault signals based on the plurality of filtering signals, the plurality of first reference signals and the plurality of second reference signals; and a control circuit, configured to generate a plurality of control signals based on the plurality of fault signals to control the plurality of switching circuits.

One embodiment of the present invention discloses a controller for a multi-phase converter, wherein the multi-phase converter comprises a plurality of switching circuits coupled in parallel, the controller comprises: a current sampling circuit, configured to generate a plurality of current sampling signals, wherein each of the plurality of current sampling signals represents an associated current flowing through a corresponding one of the plurality of switching circuits; a reference voltage generation circuit, configured to generate a first reference signal and a second reference signal based on a predetermined reference signal and a ripple threshold signal, wherein the first reference signal is equal to a sum of the predetermined reference signal and the ripple threshold signal, and the second reference signal is equal to a difference between the predetermined reference signal and the ripple threshold signal; a fault signal generation circuit, configured to generate a plurality of fault signals based on the plurality of current sampling signals, the first reference signal and the second reference signal; and a control circuit, coupled to the fault signal generation circuit to receive the plurality of fault signals, and configured to adjust a plurality of control signals based on the plurality of fault signals to control the plurality of switching circuits.

One embodiment of the present invention discloses a fault detection method for a multi-phase converter, wherein the multi-phase converter comprises a plurality of switching circuits coupled in parallel, the fault detection method comprising: generating a plurality of current sampling signals by sampling currents flowing through the plurality of switching circuits; generating a first reference signal and a second reference signal based on a predetermined reference signal and a ripple threshold signal; generating a plurality of fault signals based on comparison results of each of the plurality of current sampling signals with the first reference signal and the second reference signal; and adjusting control signals of the plurality of switching circuits based on the plurality of fault signals; wherein when one of the plurality of current sampling signals is between the first reference signal and the second reference signal, a corresponding one of the plurality of fault signals is configured to be a first state, and when the corresponding one of the plurality of fault signals remains the first state for more than a predetermined time period, a corresponding one of the control signals is configured to turn off a corresponding one of the plurality of switching circuits.

According to the embodiments of the present invention, a method of tracking the current ripple in real time is used to judge a fault, without requirements for high accuracy to detect current and large threshold value in the conventional method, the proposed method not only saves costs, but also improves the precision, accuracy and speed of the fault judgment and control.

DETAILED DESCRIPTION

Reference will not be made in detail to be preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail so as not to unnecessarily obscure aspects of the present invention.

Figure 1:
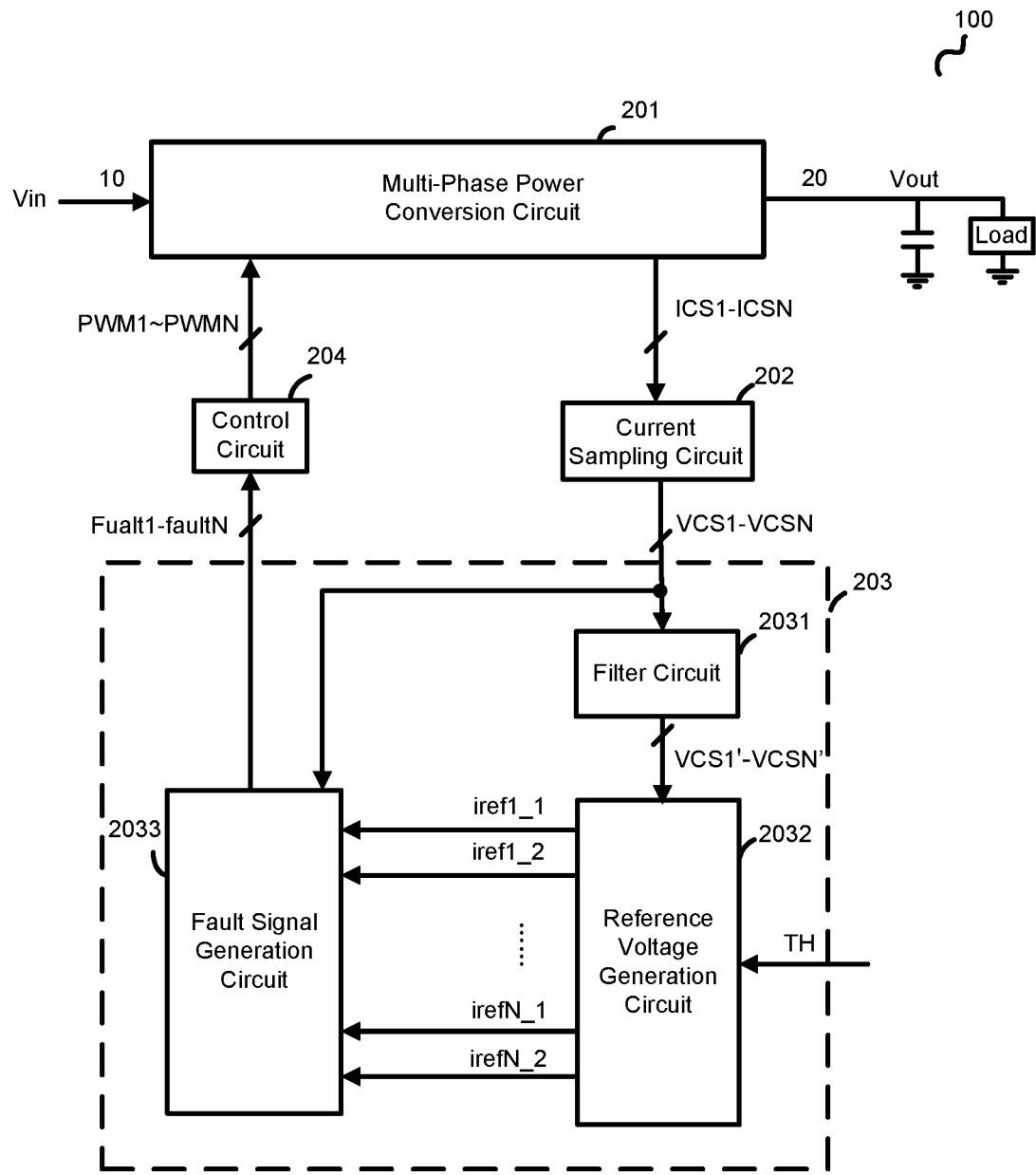
FIG. 1 illustrates a block diagram of a multi-phase converter 100 in accordance with an embodiment of the present invention.

FIG. 1 illustrates a block diagram of a multi-phase converter 100 in accordance with an embodiment of the present invention. The multi-phase converter 100 comprises a multi-phase power conversion circuit 201, a current sampling circuit 202, a fault detection circuit 203 and a control circuit 204. The multi-phase power conversion circuit 201 comprises an input terminal 10, an output terminal 20, and N switching circuits coupled in parallel between the input terminal 10 and the output terminal 20, wherein N is an integer greater than or equal to 2, the input terminal 10 is configured to receive an input voltage Vin, and the output terminal 20 is configured to provide an output voltage Vout to a load. The N switching circuits in the multi-phase power conversion circuit 201 can be DC/DC or AC/DC topologies, e.g. synchronous/non-synchronous boost converters, synchronous/non-synchronous buck converters, forward converters, or flyback converters.

The current sampling circuit 202 is coupled to the multi-phase power conversion circuit 201 to receive currents ICS1-ICSN flowing through the N switching circuits, and the current sampling circuit 202 is configured to generate N current sampling signals VCS1-VCSN representing the N currents ICS1-ICSN flowing through the N switching circuits, wherein N is an integer greater than or equal to 2. In one embodiment, each of the N current sampling signals represents an average current flowing through the corresponding switching circuit. The fault detection circuit 203 is coupled to the current sampling circuit 202 to receive the N current sampling signals VCS1-VCSN, and configured to generate N fault signals fault1-faultN based on the N current sampling signals VCS1-VCSN. The control circuit 204 is coupled to the fault detection circuit 203 to receive the N fault signals fault1-faultN, and configured to adjust N control signals PWM1-PWMN based on the N fault signals fault1-faultN. Wherein, when one of the N fault signals fault1-faultN received by the control circuit 204 indicates a switching circuit fault, the control circuit 204 is configured to adjust a corresponding control signal to maintain an associated switching circuit off, for example, when the fault signal faultN remains logic low for more than a predetermined time period T, it is judged that the corresponding Nth-phase switching circuit is fault, the control circuit 204 is configured to adjust the control signal PWMN to remain logic low, and the corresponding Nth-phase switching circuit is configured to remain off.

The fault detection circuit 203 comprises a filter circuit 2031, a reference voltage generation circuit 2032, and a fault signal generation circuit 2033. The filter circuit 2031 is coupled to the current sampling circuit 202 to receive the N current sampling signals VCS1-VCSN, and configured to filter the N circuit sampling signals VCS1-VCSN to generate corresponding N filtering signals VCS1'-VCSN'. The reference voltage generation circuit 2032 is coupled to the filter circuit 2031 to receive the N filtering signals VCS1'-VCSN', and configured to generate N first reference signals irefl_1-ifefN_1 and N second reference signals iref1_2-irefN_2 based on the N filtering signals VCS1'-VCSN' and a first ripple threshold signal TH. In one embodiment, the first reference signal irefx_1 is equal to a sum of the filtering signal VCSx' and the first ripple threshold signal TH, i.e., irefx_1VCSx'+TH, the second reference signal irefx_2 is equal to a difference between the filtering signal VCSx' and the first ripple threshold signal TH, i.e., irefx_2=VCSx'-TH, wherein the first ripple threshold signal TH can be set according to actual applications by users, or can be changed programmatically; in another embodiment, the reference voltage generation circuit 2032 can also receive a second ripple threshold signal TH', and configured to generate the first reference signals iref1_1-ifefN_1 and the second reference signals iref1_2-irefN_2 based on the filtering signals VCS1'-VCSN', the first ripple threshold signal TH and the second ripple threshold signal TH', for example, the first reference signal irefx_1 is equal to a sum of the filtering signal VCSx' and the first ripple threshold signal TH, i.e., irefx_1=VCSx'+TH, the second reference signal irefx_2 is equal to a difference between the filtering signal VCSx' and the second ripple threshold signal TH', i.e., irefx_2=VCSx'-TH'. Wherein x is larger than or equal to 1 and is less than or equal to N, i.e., 1≤X≤N. The fault signal generation circuit 2033 is coupled to the current sampling circuit 202 and the reference voltage generation circuit 2032 to receive the current sampling signals VCS1-VCSN, the first reference signals iref1_1-ifefN_1 and the second reference signals iref1_2-irefN_2, and the fault signal generation circuit 2033 is configured to compare each current sampling signal VCSx with the corresponding first reference signal irefx_1 and the corresponding second reference signal irefx_2 at the same time to generate the fault signals faultx. In one embodiment, when a value of the current sampling signal VCSx is between the corresponding first reference signal irefx_1 and the corresponding second reference signal irefx_2, the fault signal faultx is configured to be a first state, e.g., logic low, and when the fault signal faultx remains the first state for more than a predetermined time period T, the corresponding switching circuit is judged fault.

Figure 2:
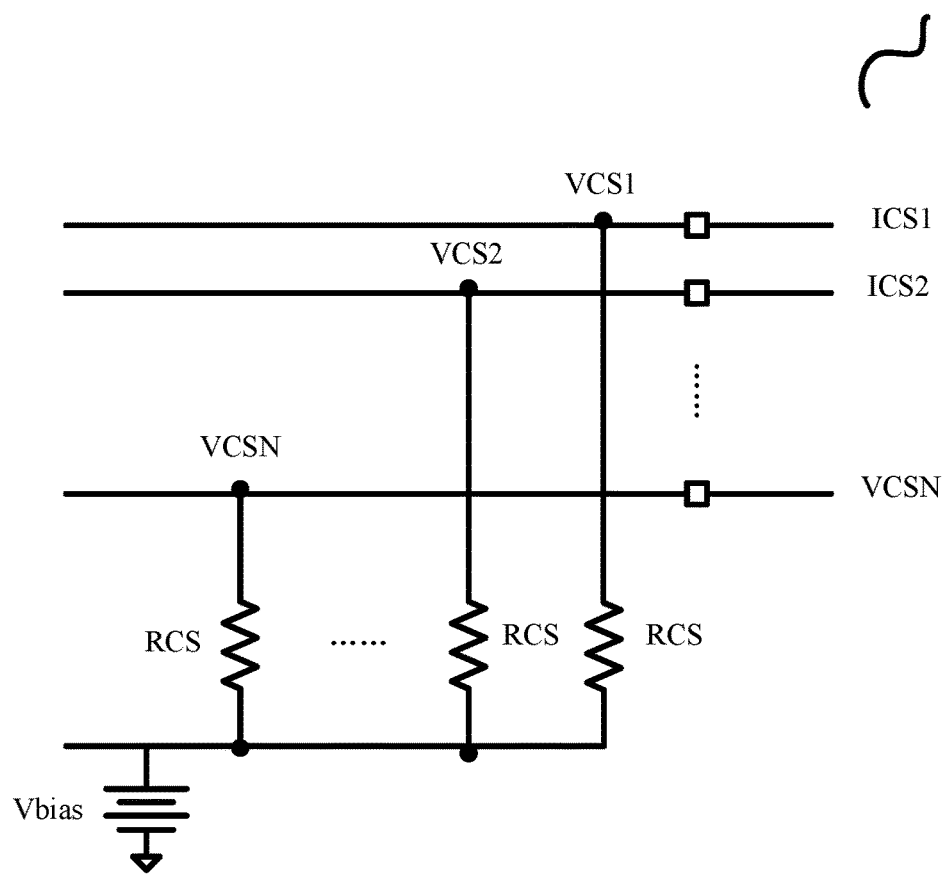
FIG. 2 illustrates a circuit schematic of a current sampling circuit 202 shown in FIG. 1 in accordance with an embodiment of the present invention.

FIG. 2 illustrates a circuit schematic of the current sampling circuit shown in FIG. 1 in accordance with an embodiment of the present invention. In the embodiment shown in FIG. 2, the current sampling circuit 202 comprises N sampling resistors RCS. Each sampling resistor RCS comprises a first terminal and a second terminal, wherein the first terminal is configured to receive the current ICSx flowing through the corresponding switching circuit, the second terminal is coupled to a bias voltage Vbias, and the current sampling signal VCSx generated by the current sampling circuit 202 can be calculated by following equation (1).

$$VCSx=RCS*ICSx+Vbias \quad (1)$$

In one embodiment, Vbias is equal to a value of the corresponding current sampling signal when the current flowing through the corresponding switching circuit (which? a current flowing through one of the switching circuits?) is zero.

Figure 3A:
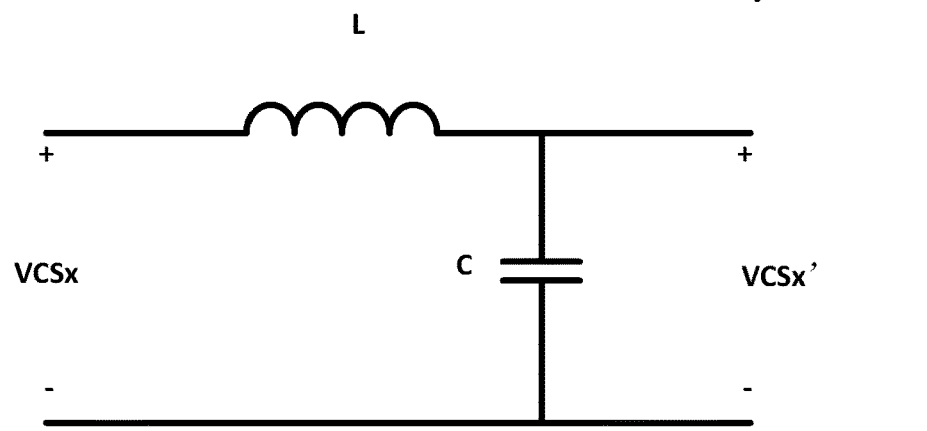
FIG. 3A illustrates a circuit schematic of the filter circuit 2031 shown in FIG. 1 in accordance with an embodiment of the present invention.

FIG. 3A illustrates a circuit schematic of the filter circuit 2031 shown in FIG. 1 in accordance with an embodiment of the present invention. In one embodiment, the filter circuit 2031 comprises a low-pass filter configured to dispel high frequency for the current sampling signals. The high-frequency part is the part above a cut-off frequency. The cut-off frequency can be judged by users as needed. As shown in FIG. 3A, the filter circuit 2031 comprises an inductor L and a capacitor C, the inductor L comprises a first terminal and a second terminal, the capacitor C comprises a first terminal and a second terminal, wherein the first terminal of the inductor L and the second terminal of the capacitor C are configured to receive the current sampling signal VCSx, and the second terminal of the inductor L is coupled to the first terminal of the capacitor C to receive a voltage across the capacitor C to generate the filtering signal VCSx'. Inductance of the inductor L and capacitance of the capacitor C can be judged by users as needed. In other embodiments, the filter circuit 2031 may be a first-order RC low-pass filter or a multi-order RC low-pass filter.

Figure 3B:
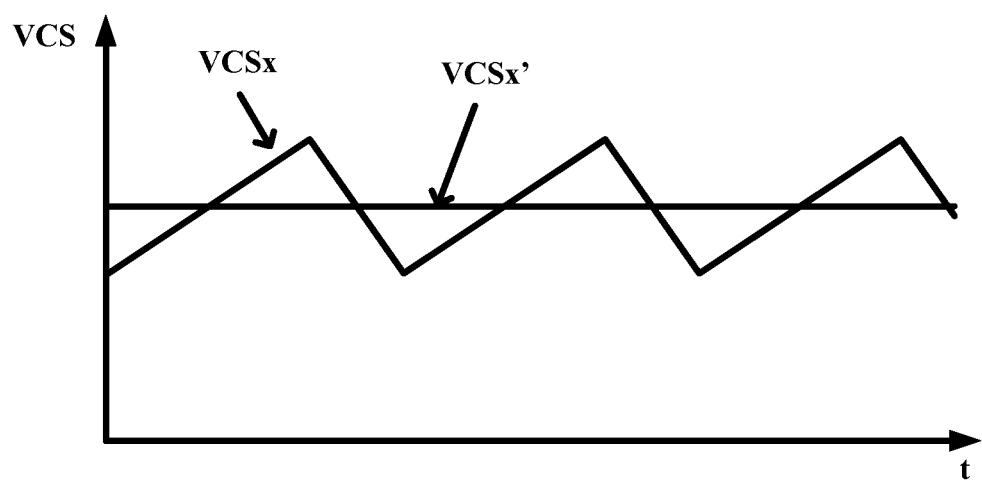
FIG. 3B illustrates waveforms of a filtering signal shown in FIG. 3A in accordance with an embodiment of the present invention.

FIG. 3B illustrates waveforms of the filtering signal shown in FIG. 3A in accordance with an embodiment of the present invention. In the embodiment shown in FIG. 3B, a waveform of the voltage sampling signal VCSx with time t is a triangular wave signal, and after filtering, the waveform of the filtered signal VCSx' with time t is a constant signal.

Figure 4:
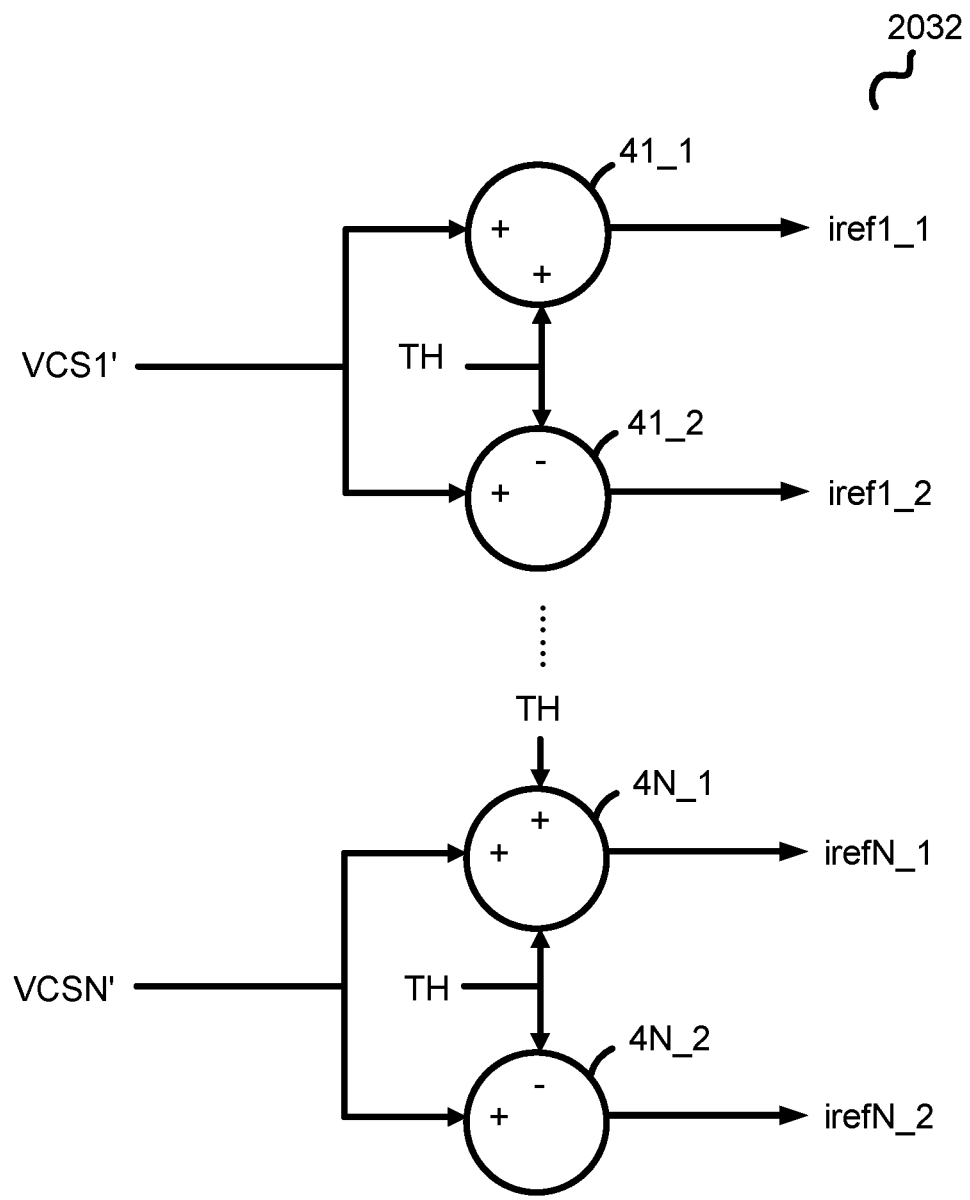
FIG. 4 illustrates a circuit schematic of a reference voltage generation circuit 2032 shown in FIG. 1 in accordance with an embodiment of the present invention.

FIG. 4 illustrates a circuit schematic of the reference voltage generation circuit 2032 shown in FIG. 1 in accordance with an embodiment of the present invention. The reference voltage generation circuit 2032 comprises N adders 41_1-4N_1 and N subtractors 4N_1-4N_2, each adder 4$x$_1 comprises a first input terminal, a second input terminal and an output terminal, wherein the first input terminal of the adder 4$x$_1 is configured to receive the corresponding filtering signal VCSx', the second input terminal of the adder 4$x$_1 is configured to receive the first ripple threshold signal TH, the adder 4$x$_1 is configured to add the corresponding filtering signal VCSx' and the first ripple threshold signal TH to output the first reference signal irefx_1, i.e., irefx_1=VCSx'+TH at the output terminal of the adder 4$x$_1; each subtractor 4$x$_2 comprises a first input terminal, a second input terminal and an output terminal, wherein the first input terminal of the subtractor 4$x$_2 is configured to receive the corresponding filtering signal VCSx', the second input terminal of the subtractor 4$x$_2 is configured to receive the corresponding first ripple threshold signal TH, and the subtractor 4$x$_2 is configured to subtract the ripple threshold signal TH from the corresponding filtering signal VCSx', and the output terminal of the subtractor 4$x$_2 is configured to provide the second reference signal irefx_2, i.e., irefx_2=VCSx'-TH. In one embodiment, the first ripple threshold signal TH may be 50 mV.

Figure 5A:
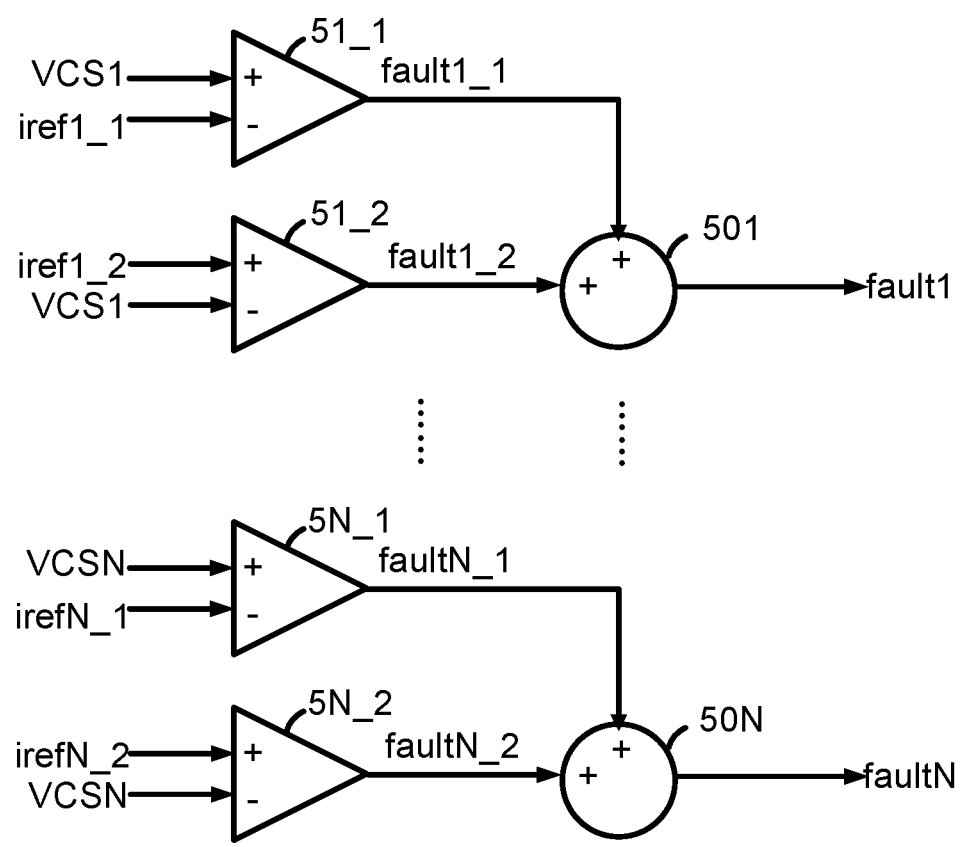
FIG. 5A illustrates a circuit schematic of a fault signal generation circuit 2033 shown in FIG. 1 in accordance with an embodiment of the present invention.

FIG. 5A illustrates a circuit schematic of the fault signal generation circuit 2033 shown in FIG. 1 in accordance with an embodiment of the present invention. The fault signal generation circuit 2033 comprises N first comparators 51_1-5N_1, N second comparators 51_2-5N_2, and N adders 501-50N. Each first comparator 5$x$_1 comprises a non-inverting input terminal, an inverting input terminal and an output terminal, wherein the non-inverting input terminal is coupled to the current sampling circuit 202 to receive the current sampling signal VCSx, and the inverting input terminal is coupled to the reference voltage generation circuit 2032 to receive the first reference signal irefx_1. The first comparator 5$x$_1 is configured to compare the current sampling signal VCSx with the first reference signal irefx_1 to generate a first comparison signal faultx_1, and the output terminal of the first comparator 5$x$_1 is configured to provide the first comparison signal faultx_1. Each second comparator 5$x$_2 comprises a non-inverting input terminal, an inverting input terminal and an output terminal, wherein the non-inverting input terminal of the second comparator 5$x$_2 is configured to receive the second reference signal irefx_2, and the inverting input terminal of the second comparator 5$x$_2 is coupled to the current sampling circuit 202 to receive the current sampling signal VCSx. The second comparator 5$x$_2 is configured to compare the second reference signal irefx_2 with the current sampling signal VCSx to generate a second comparison signal faultx_2, and the output terminal of the second comparator 5$x$_2 is configured to provide the second comparison signal faultx_2. Each adder 50$x$ comprises a first input terminal, a second input terminal and an output terminal, wherein the first input terminal of the adder 50$x$ is coupled to the output terminal of the first comparator 5$x$_1 to receive the first comparison signal faultx_1, and the second input terminal of the adder 50x is coupled to the output terminal of the second comparator 5x_2 to receive the second comparison signal faultx_2. The adder 50x is configured to sum the first comparison signal faultx_1 and the second comparison signal faultx_2, and configured to generate the fault signal faultx at the output terminal, i.e. faultx=faultx_1+faultx_2, and the output terminal of the adder 50x is configured to provide the fault signal faultx.

Figure 5B:
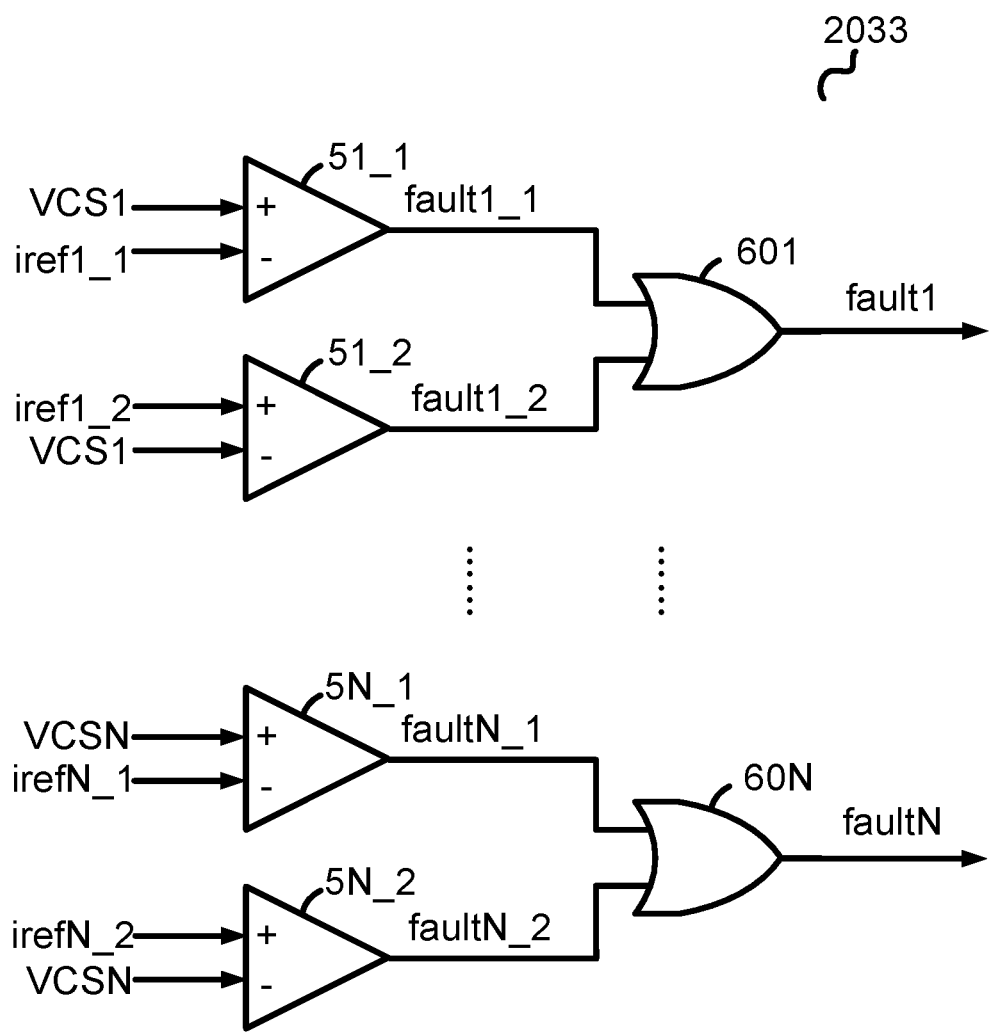
FIG. 5B illustrates a circuit schematic of the fault signal generation circuit 2033 shown in FIG. 1 in accordance with another embodiment of the present invention.

FIG. 5B illustrates a circuit schematic of the fault signal generation circuit 2033 shown in FIG. 1 in accordance with another embodiment of the present invention. As shown in FIG. 5B, the fault signal generation circuit 2033 comprises N first comparators 51_1-5N_1, N second comparators 51_2-5N_2, and N OR gates 601-60N, wherein the N first comparators 51_1-5N_1 and the N second comparators 51_2-5N_2 are basically the same as the corresponding circuits shown in FIG. 5_1. Each OR gate 60x comprises a first input terminal, a second input terminal and an output terminal, wherein the first input terminal of the OR gate 60x is coupled to the output terminal of the first comparator 5x_1 to receive the first comparison signal faultx_1, and the second input terminal of the OR gate 60x is coupled to the output terminal of the second comparator 5x_2 to receive the second comparison signal faultx_2, the OR gate 60x is configured to generate the fault signal faultx at the output terminal via an OR operation. In one embodiment, when the first comparison signal faultx_1 or the second comparison signal faultx_2 is logic high, the corresponding fault signal faultx is logic High, that is, when the current sampling signal VCSx is greater than the first reference signal irefx_1 or less than the second reference signal irefx_2, the corresponding fault signal faultx is configured to be logic high, and when the current sampling signal VCSx is between the first reference signal irefx_1 and the second reference signal irefx_2, the corresponding fault signal faultx is configured to be logic low.

In one embodiment, when the fault signal faultx remains logic low for more than a predetermined time period T, it is judged that the corresponding x-th switching circuit is fault, and the associated control signal PWMx is adjusted to maintain the corresponding N-th switching circuit off, e.g., maintaining the associated control signal PWMx logic low.

Figure 6:
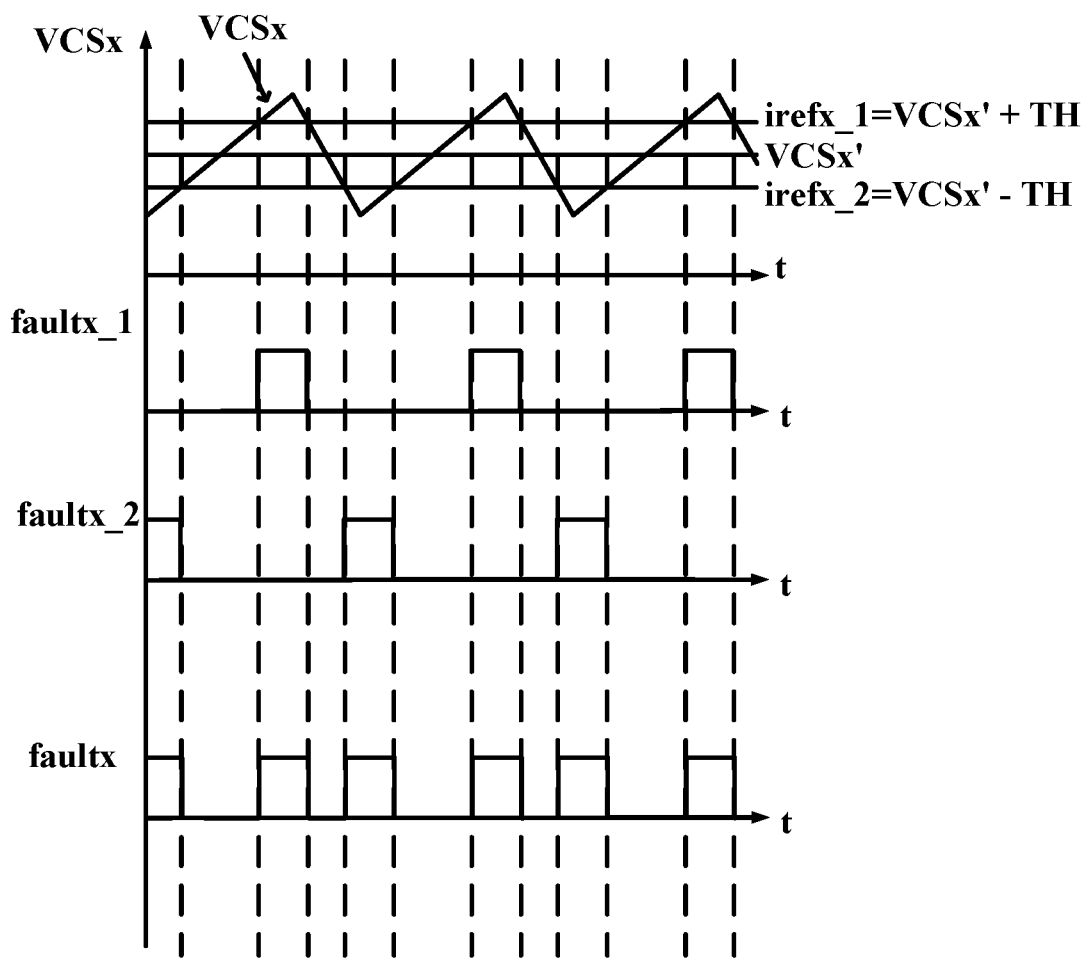
FIG. 6 illustrates waveforms of a fault signal shown in FIG. 5A in accordance with an embodiment of the present invention.

FIG. 6 illustrates waveforms of the fault signal faultx shown in FIG. 5A in accordance with an embodiment of the present invention. As shown in FIG. 6, when the current sampling signal VCSx is greater than the first reference signal irefx_1, the first comparison signal faultx_1 becomes logic high, otherwise it is logic low; when the current sampling signal VCSx is less than the second reference signal irefx_2, the second comparison signal faultx_2 becomes logic high, otherwise it is logic low; when the current sampling signal VCSx is greater than the first reference signal irefx_1 or less than the second reference signal irefx_2, the fault signal faultx is configured to become the first state to indicate a fault happens, e.g., becomes logic high, otherwise the fault signal faultx maintains the second state, e.g., logic low. In one embodiment, the waveform corresponding to the fault signal faultx described in FIG. 5B is substantially the same as FIG. 6.

In one embodiment, when one of the switching circuits fails, the current flowing through the corresponding switching circuit will become 0 or close to 0. At this time, a value of the current sampling signal VCSx of the corresponding switching circuit is close to the filtering signal VCSx', that is, the current sampling signal VCSx is between the first reference signal irefx_1 and the second reference signal irefx_2, neither the first comparator 5x_1 nor the second comparator 5x_2 is configured to flip, the first comparison signal faultx_1, the second comparison signal faultx_2 and the fault signal faultx are configured to remain logic low. Therefore, in one embodiment, when it is detected that the fault signal faultx keeps logic low for more than a predetermined time period T, it is judged that the corresponding switching circuit is fault, the control circuit 204 is configured to adjust the associated control signal PWMx to maintain logic low, and the corresponding switching circuit is configured to maintain off.

Figure 7:
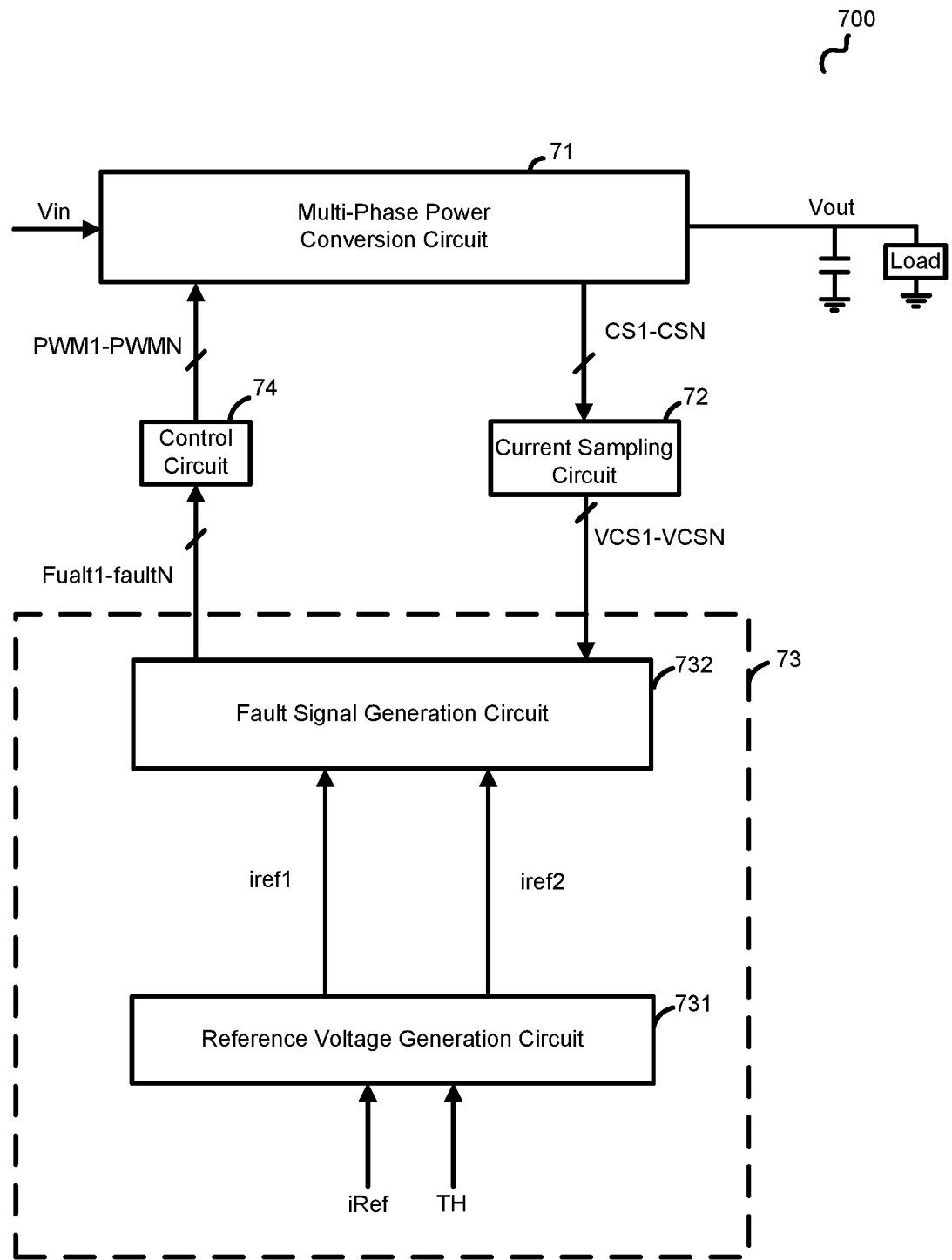
FIG. 7 illustrates a block diagram of a multi-phase converter 700 in accordance with another embodiment of the present invention.

FIG. 7 illustrates a block diagram of a multi-phase converter 700 in accordance with another embodiment of the present invention. The multi-phase converter 700 comprises a multi-phase power conversion circuit 71, a current sampling circuit 72, a fault detection circuit 73, and a control circuit 74. The multi-phase power conversion circuit 71 comprises N switching circuits, wherein N is an integer greater than or equal to 2. Each of the N switching circuits having an output terminal coupled to the load. The multi-phase power conversion circuit 71, the current sampling circuit 72, and the control circuit 74 are basically the same as the corresponding circuits in the foregoing embodiments.

The fault detection circuit 73 comprises a reference voltage generation circuit 731 and a fault signal generation circuit 732. The reference voltage generation circuit 731 is configured to receive a predetermined reference signal iRef and the first ripple threshold signal TH, and the reference voltage generation circuit 731 is configured to generate a first reference signal iref1 and a second reference signal iref2 based on the predetermined reference signal iRef and the first ripple threshold signal TH. In one embodiment, the first reference signal iref1 is equal to a sum of the predetermined reference signal iRef and the first ripple threshold signal TH, i.e. iref1=iRef+TH, the second reference signal is equal to a difference between the predetermined reference signal iRef and the first ripple threshold signal TH, i.e., iref2=iRef-TH, wherein the first ripple threshold signal TH can be set according to the actual applications by users, or can be changed programmatically. In one embodiment, the predetermined reference signal iRef may be equal to a value of the corresponding current sampling signal when the current flowing through the corresponding switching circuit is 0, i.e., corresponding to the bias voltage Vbias in the embodiment shown in FIG. 2. In another embodiment, the reference voltage generating circuit 731 may also be configured to receive a second ripple threshold signal TH', and configured to generate the first reference iref1 and the second reference iref2 based on the predetermined reference signal iRef, the first ripple threshold signal TH and the second ripple threshold signal TH'. For example, the first reference signal iref1 is configured to be equal to a sum of the predetermined reference signal iRef and the first ripple threshold signal TH, i.e. iRef1=iRef+TH, the second reference voltage signal iref2 is configured to be equal to a difference between the predetermined reference signal iRef and the second ripple threshold signal TH', i.e. iRef2=iRef−TH'. The fault signal generation circuit 732 is respectively coupled to the current sampling circuit 72 and the reference voltage generation circuit 731 to receive the N current sampling signals VCS1-VCSN', the first reference voltage signal iref1 and the second reference voltage signal ifef2, and is configured to compare each current sampling signal VCSx with the first reference signal iref1 and the second reference signal iref2 respectively, and finally configured to generate the fault signals fault1-faultN. In one embodiment, when the value of the current sampling signal VCSx is between the first reference signal iref1 and the second reference signal iref2, the fault signal faultx is configured to be logic low, and when the fault signal faultx remains logic low for more than a predetermined time period T, the corresponding x-th switching circuit is judged fault.

Figure 8:
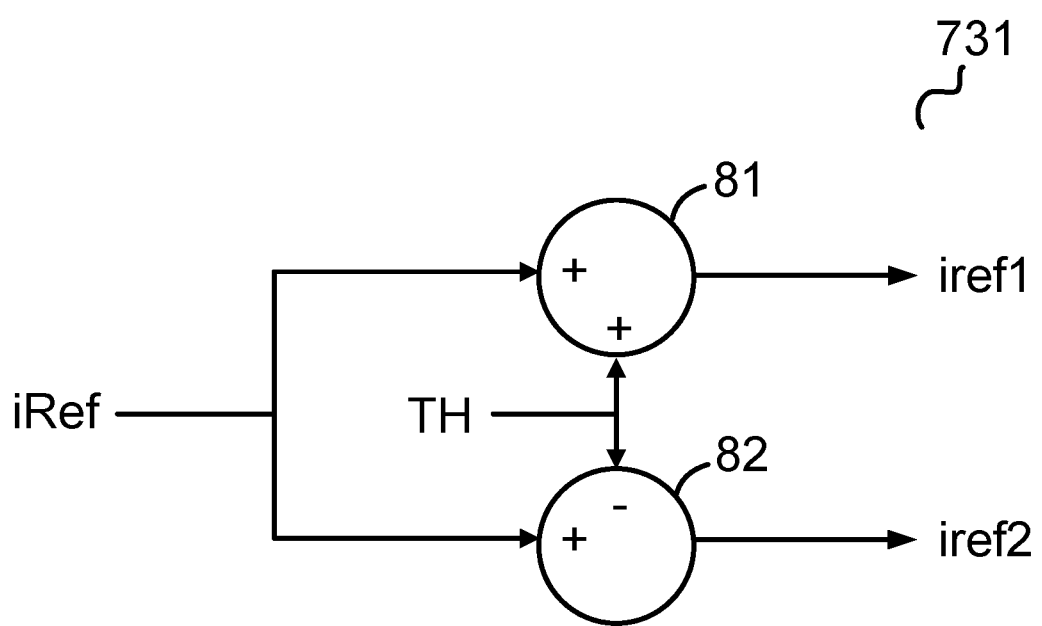
FIG. 8 illustrates a circuit schematic of the reference voltage generation circuit 731 shown in FIG. 7 in accordance with an embodiment of the invention.

FIG. 8 illustrates a circuit schematic of the reference voltage generation circuit 731 shown in FIG. 7 in accordance with an embodiment of the invention. The reference voltage signal generation circuit 731 comprises an adder 81 and a subtractor 82, the adder 81 comprises a first input terminal, a second input terminal and an output terminal, wherein the first input terminal is configured to receive the predetermined reference signal iRef, the second input terminal of the adder 81 is configured to receive the first ripple threshold signal TH, and the adder 81 is configured to sum the predetermined reference signal iRef and the first ripple threshold signal TH to generate the first reference voltage signal iref1, i.e., iref1=iRef+TH, and the output terminal of the adder 81 is configured to provide the first reference voltage signal iref1; the subtractor 82 comprises a first input terminal, a second input terminal, and an output terminal, wherein the first input terminal of the subtractor 82 is configured to receive the predetermined reference signal iRef, the second input terminal of the subtractor 82 is configured to receive the first ripple threshold signal TH, and the subtractor 82 is configured to evaluate a difference between the predetermined reference signal iRef and the ripple threshold signal TH, and the second reference voltage signal iref2 is configured to be provided at the output terminal of the subtractor 82 thereof, i.e., iref2=iRef-TH.

Figure 9A:
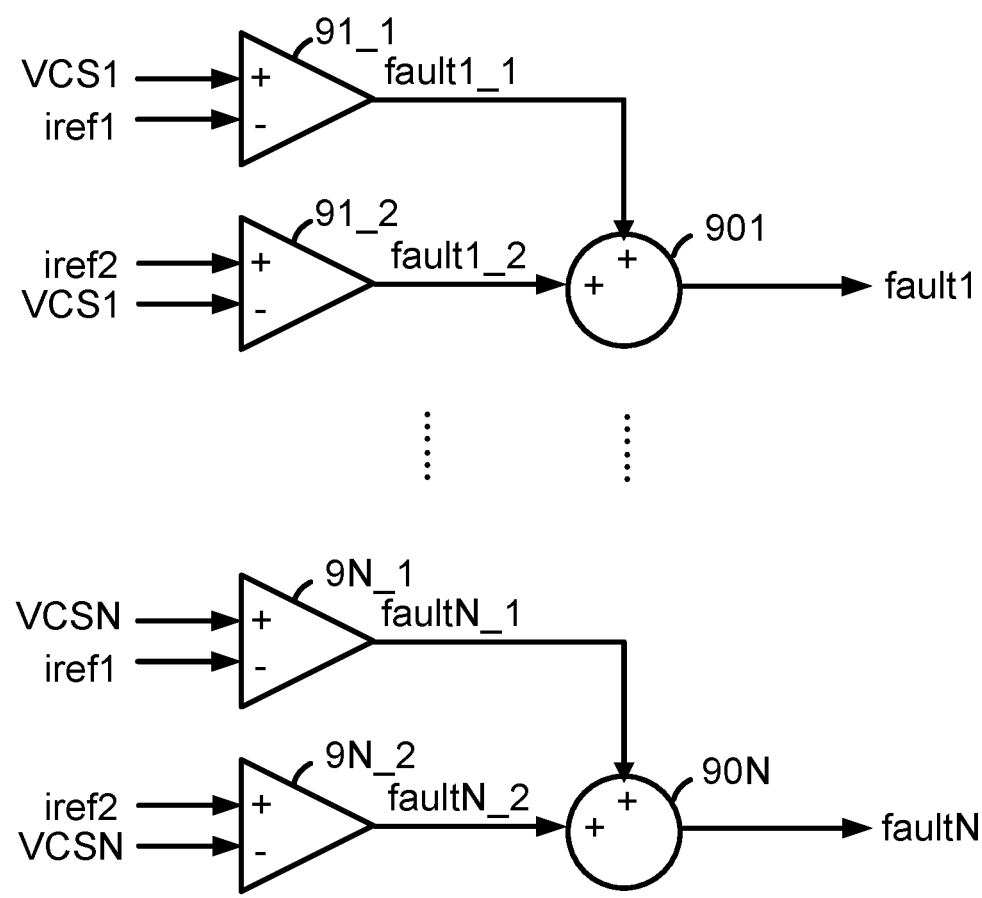
FIG. 9A illustrates a circuit schematic of a fault signal generation circuit 732 shown in FIG. 7 in accordance with an embodiment of the present invention.

FIG. 9A illustrates a circuit schematic of the fault signal generation circuit 732 shown in FIG. 7 in accordance with an embodiment of the present invention. The fault signal generating circuit 732 comprises N first comparators 91_1-9N_1, N second comparators 91_2-9N_2, and N adders 901-90N. Each first comparator 9x_1 comprises a non-inverting input terminal, an inverting input terminal and an output terminal, wherein the non-inverting input terminal of the first comparator 9x_1 is coupled to the current sampling circuit 72 to receive the current sampling signal VCSx, and the inverting input terminal of the first comparator 9x_1 is coupled to the reference voltage generation circuit 731 to receive the first reference signal iref1, the first comparator 9x_1 is configured to compare the current sampling signal VCSx with the first reference signal iref1, and the output terminal of the comparator 9x_1 is configured to provide a first comparison signal faultx_1. Each second comparator 9x_2 comprises a non-inverting input terminal, an inverting input terminal and an output terminal, wherein the non-inverting input terminal of the second comparator 9x_2 is configured to receive the second reference signal iref2, and the inverting input terminal of the second comparator 9x_2 is coupled to the current sampling circuit 72 to receive the current sampling signal VCSx, the second comparator 9x_2 is configured to compare the second reference signal iref2 with the current sampling signal VCSx, and configured to generate a second comparison signal faultx_2, the output terminal of the second comparator 9x_2 is configured to provide the second comparison signal faultx_2. Each adder 90x comprises a first input terminal, a second input terminal and an output terminal, wherein the first input terminal of the adder 90x is coupled to the output terminal of the first comparator 9x_1 to receive the first comparison signal faultx_1, and the second input terminal of the adder 90x is coupled to the output terminal of the second comparator 9x_2 to receive the second comparison signal faultx_2, the adder 90x is configured to sum the first comparison signal faultx_1 and the second comparison signal faultx_2, that is, the first comparison signal faultx_1 and the second comparison signal faultx_2 are superimposed to generate the fault signal fualtx, i.e., faultx=faultx_1+faultx_2, and the output terminal of the adder 90x is configured to provide the fault signal fualtx.

Figure 9B:
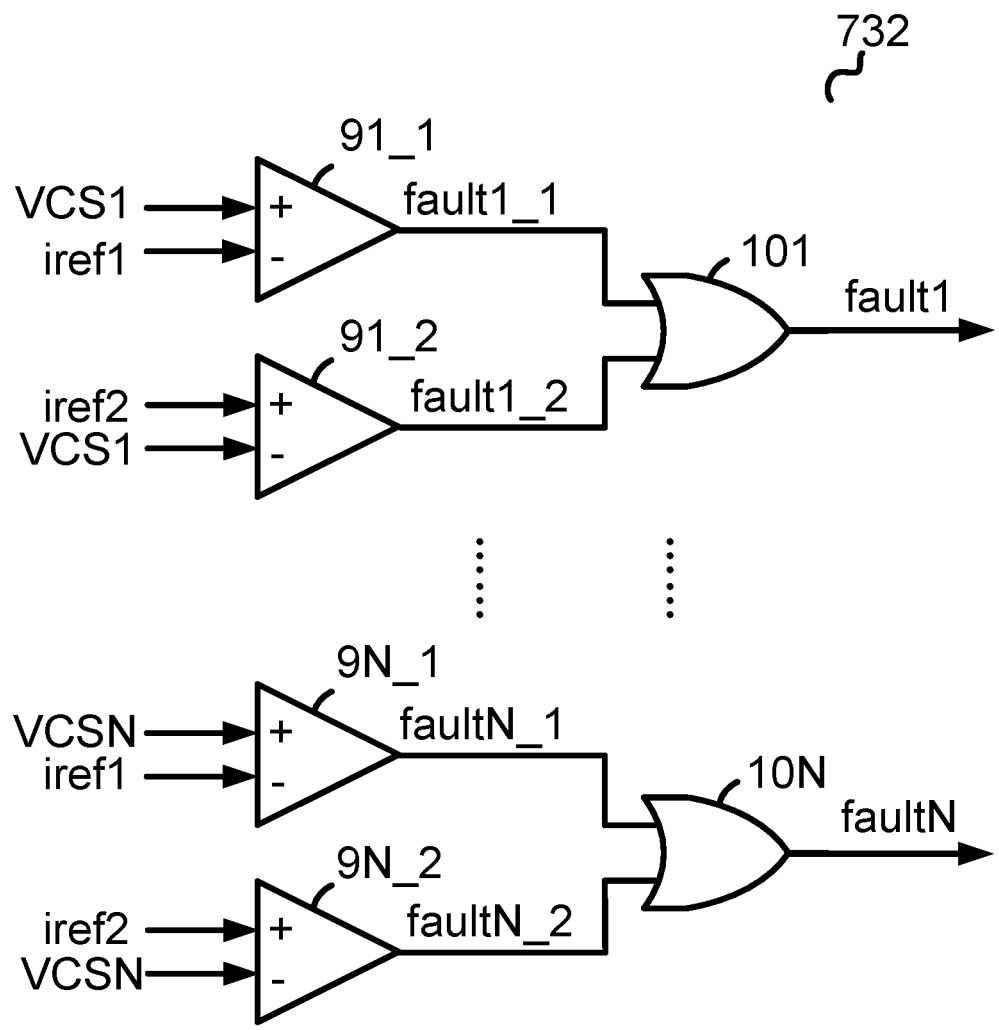
FIG. 9B illustrates a circuit schematic of the fault signal generation circuit 732 shown in FIG. 7 in accordance with another embodiment of the present invention.

FIG. 9B illustrates a circuit schematic of the fault signal generation circuit 732 shown in FIG. 7 in accordance with another embodiment of the present invention. The fault signal generation circuit 732 comprises N first comparators 91_1-9N_1, N second comparators 91_2-9N_2 and N OR gates 101-10N, wherein the N first comparators 91_1-9N_1 and the N second comparators 91_2-9N_2 are basically the same as the corresponding circuits shown in FIG. 9_1. Each OR gate 10x comprises a first input terminal, a second input terminal and an output terminal, wherein the first input terminal of the OR gate 10x is coupled to the output terminal of the first comparator 9x_1 to receive the first comparison signal faultx_1, and the second input terminal of the OR gate 10x is coupled to the output terminal of the second comparator 9x_2 to receive the second comparison signal faultx_2, the OR gate 10x is configured to output the fault signal faultx at the output terminal of the OR gate 10x. When the first comparison signal faultx_1 or the second comparison signal faultx_2 is logic high, the fault signal faultx is configured to be logic High, i.e., when the current sampling signal VCSx is greater than the first reference signal iref1 or less than the second reference signal iref2, the corresponding fault signal faultx is configured to be logic high, and when the current sampling signal VCSx is between the first reference signal iref1 and the second reference signal iref2, the corresponding fault signal faultx is configured to be logic low.

Figure 10:
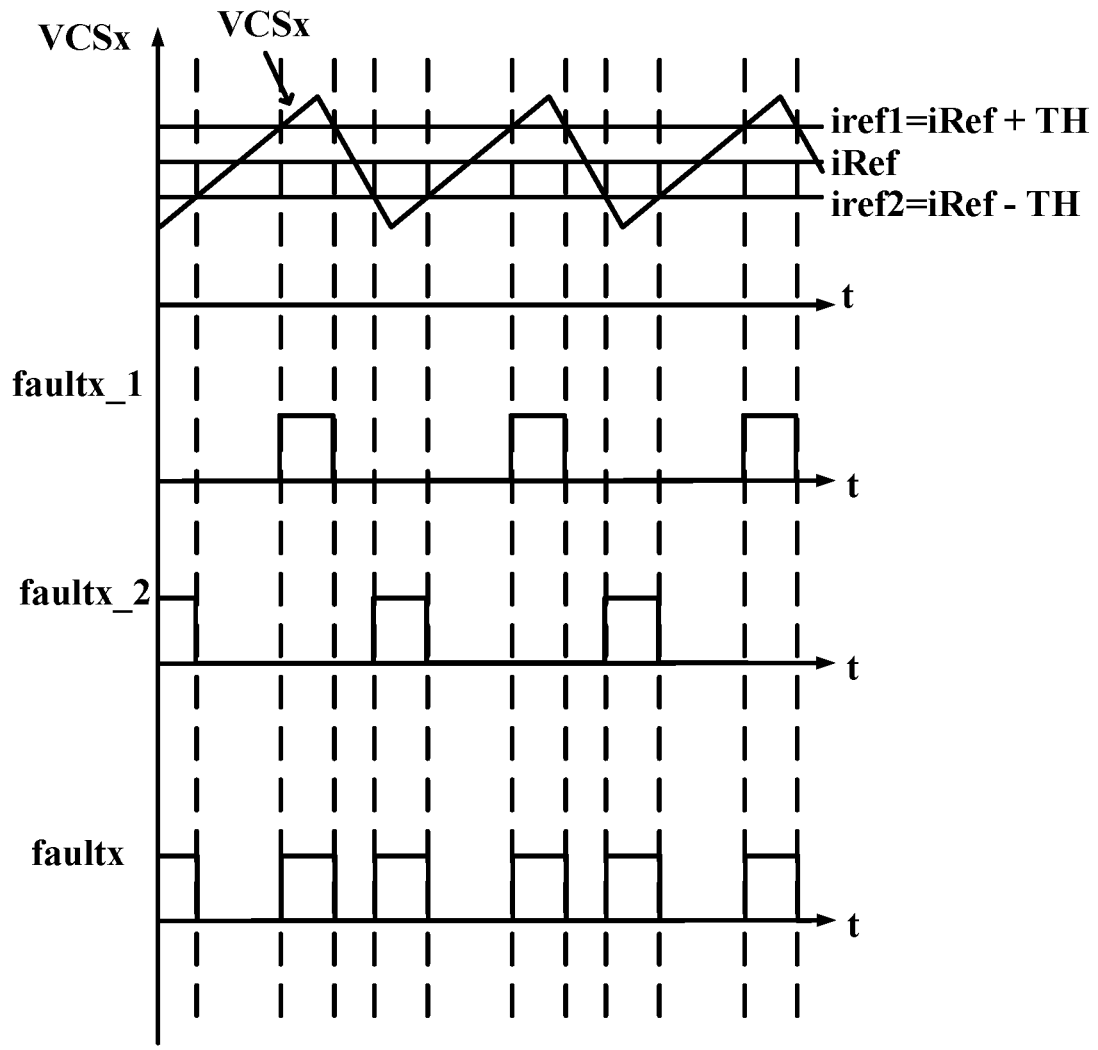
FIG. 10 illustrates waveforms of a fault signal shown in FIG. 9 in accordance with an embodiment of the present invention.

FIG. 10 illustrates the waveform of the fault signal shown in FIG. 9A in accordance with an embodiment of the present invention. In the embodiment shown in FIG. 6, when the current sampling signal VCSx is greater than the first reference signal iref1, the first comparison signal faultx_1 is configured to become logic high, otherwise it is configured to be logic low; when the current sampling signal VCSx is less than the second reference signal iref2, the second comparison signal faultx_2 is configured to become logic high, otherwise it is configured to be logic low; when the current sampling signal VCSx is greater than the first comparison signal iref1 or less than the second comparison signal iref2, the fault signal faultx is configured to become logic high, otherwise the fault signal faultx is configured to be logic low. In one embodiment, the waveform corresponding to the fault signal faultx described in FIG. 9B is substantially the same as FIG. 10.

Figure 11:
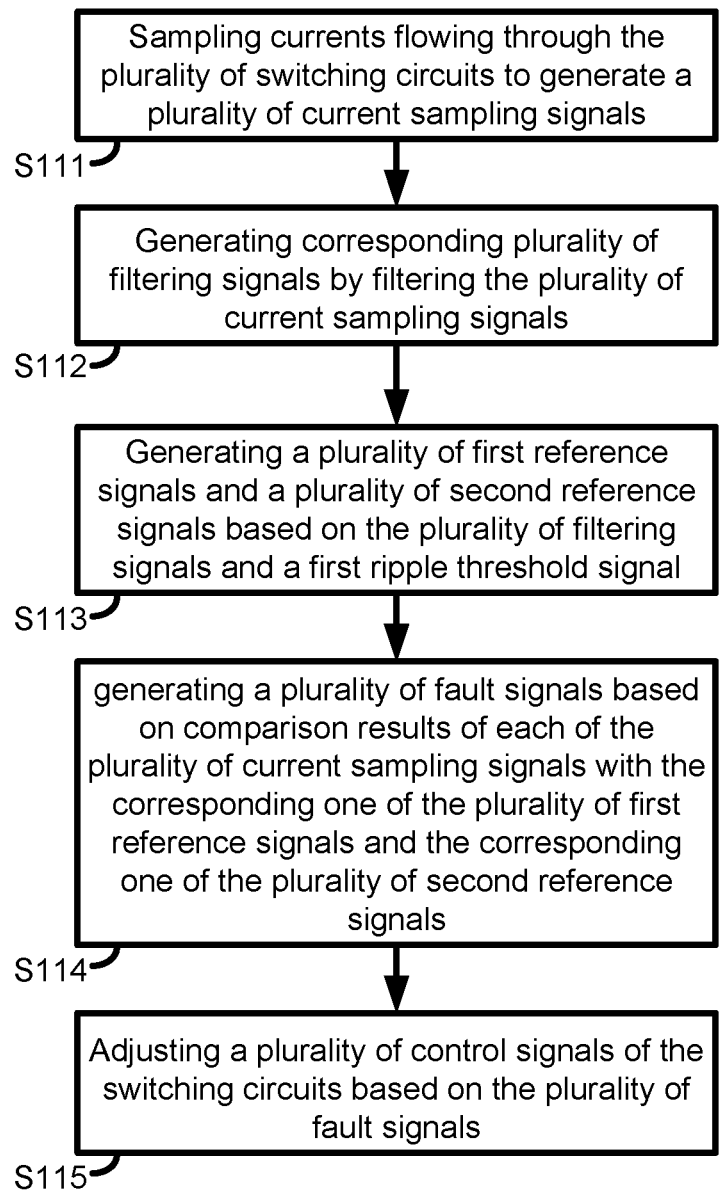
FIG. 11 illustrates a flowchart of a control method for a multi-phase converter in accordance with an embodiment of the present invention.

FIG. 11 illustrates a flowchart of a control method for a multi-phase converter in accordance with an embodiment of the present invention, wherein the multi-phase converter comprises a plurality of switching circuits, and each of the plurality of switching circuits having an output terminal coupled to a load, the method comprising steps S111-S115.

At step S111, sampling currents flowing through the plurality of switching circuits to generate a plurality of current sampling signals.

At step S112, generating corresponding plurality of filtering signals by filtering the plurality of current sampling signals.

At step S113, generating a plurality of first reference signals and a plurality of second reference signals based on the plurality of filtering signals and a first ripple threshold signal. In one embodiment, the plurality of first reference signals are configured to be equal to a sum of each of the plurality of filtering signals and the ripple threshold signal, and the plurality of second reference signals are configured to be equal to a difference between each of the plurality of filtering signals and the ripple threshold signal, so each of the plurality of switching circuits comprises a first reference and a second reference signal, and the multi-phase converter comprises N first references signal and N second reference signals.

At step S114, generating a plurality of fault signals based on comparison results of each of the plurality of current sampling signals with a corresponding one of the plurality of first reference signals and a corresponding one of the plurality of second reference signals. In one embodiment, each of the plurality of current sampling signal is compared with the corresponding one of the plurality of first reference signals and the corresponding one of the plurality of second reference signal respectively, then a plurality of corresponding first comparison signals and a plurality of second comparison signals are generated. When one of the plurality of first comparison signals or one of the plurality of second comparison signals is logic high, a corresponding one of the plurality of fault signals is configured to be logic high.

At step S115, adjusting a plurality of control signals of the switching circuits based on the plurality of fault signals. In one embodiment, when the value of each of the plurality of current sampling signals is between the corresponding one of the plurality of first reference signals and the corresponding one of the plurality of second reference signal, the corresponding one of the plurality of fault signals is configured to be logic low, and when the one of the plurality of fault signals remains logic low for more than a predetermined time period, It is judged that a corresponding one of the plurality of switching circuits is fault, and a corresponding one of the plurality of control signal is configured to be adjusted to first state (e.g. logic low) and continuously maintain first state (e.g. logic low), and the corresponding one of the plurality of switching circuits is configured to maintain off.

Figure 12:
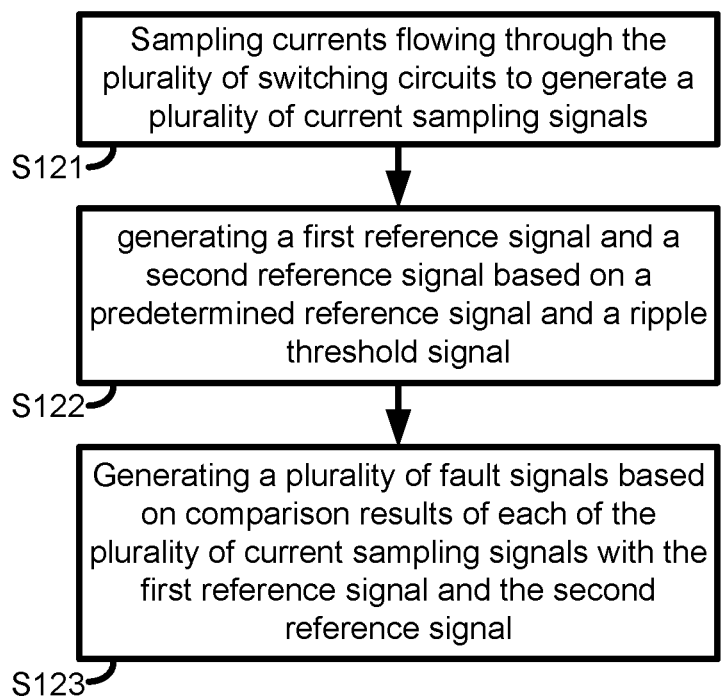
FIG. 12 illustrates a flowchart of a fault detection method for a multi-phase converter in accordance with an embodiment of the present invention.

FIG. 12 illustrates a flowchart of a fault detection method for a multi-phase converter in accordance with an embodiment of the present invention, wherein the multi-phase converter comprises a plurality of switching circuits, and each of the plurality of switching circuits having an output terminal coupled to a load, the method comprising steps S121-S123.

At step S121, sampling currents flowing through the plurality of switching circuits to generate a plurality of current sampling signals.

At step S122, generating a first reference signal and a second reference signal based on a predetermined reference signal and a ripple threshold signal. In one embodiment, the first reference signal is equal to a sum of the predetermined reference signal and the ripple threshold signal, the second reference signal is equal to a difference between the predetermined reference signal and the ripple threshold signal. Therefore, the multi-phase converter comprises only one fixed first reference signal and one fixed second reference signal.

At step S123, generating a plurality of fault signals based on comparison results of each of the plurality of current sampling signals with the first reference signal and the second reference signal. In one embodiment, each of the plurality of current sampling signals is compared with the first reference signal and the second reference signal respectively, and corresponding plurality of first comparison signal and corresponding plurality of second comparison signal are generated. In one embodiment, when one of the plurality of first comparison signals or one of the plurality of second comparison signal is logic high, a corresponding one of the plurality of fault signals is configured to be logic high.

In one embodiment, when a value of one of the plurality of the current sampling signals is between the first reference signal and the second reference signal, the corresponding one of the plurality of fault signals is configured to be a first state (e.g. logic low), and when the fault signal remains first state for more than a predetermined time period, it is judged that a corresponding one of plurality of switching circuits fault.

Although the present invention has been described with reference to several exemplary embodiments, it should be understood that the terms used are illustrative and exemplary rather than restrictive. Since the present invention can be implemented in various forms without departing from the spirit or essence of the invention, it should be understood that the above embodiments are not limited to any of the foregoing details, but should be widely interpreted within the spirit and scope defined by the appended claims Therefore, all changes and modifications falling within the scope of the claims or their equivalents should be covered by the appended claims.

We claim:

1. A controller for a multi-phase converter, wherein the multi-phase converter comprises a plurality of switching circuits coupled in parallel, the controller comprising:
   a current sampling circuit, configured to generate a plurality of current sampling signals, wherein each of the plurality of current sampling signals represents an associated current flowing through a corresponding one of the plurality of switching circuits;
   a filter circuit, configured to generate a plurality of filtering signals by filtering the plurality of current sampling signals;
   a reference voltage generation circuit, coupled to the filter circuit to receive the plurality of filtering signals, and configured to generate a plurality of first reference signals and a plurality of second reference signals based on the plurality of filtering signals and a ripple threshold signal, wherein each of the plurality of first reference signals is equal to a sum of a corresponding one of the plurality of filtering signals and the ripple threshold signal, each of the plurality of second reference signals is equal to a difference between the corresponding one of the plurality of filtering signals and the ripple threshold signal;
   a fault signal generation circuit, configured to generate a plurality of fault signals based on the plurality of filtering signals, the plurality of first reference signals and the plurality of second reference signals; and
   a control circuit, configured to generate a plurality of control signals based on the plurality of fault signals to control the plurality of switching circuits respectively.

2. The controller of claim 1, wherein when one of the plurality of current sampling signals is between a corresponding one of the plurality of first reference signals and a corresponding one of the plurality second reference signals, a corresponding one of the plurality of fault signals is configured to be a first state, and when the corresponding one of the plurality of fault signal remains the first state for more than a predetermined time period, a corresponding one of the plurality of control signals is configured to turn off the corresponding one of the plurality of switching circuits.

3. The controller of claim 1, wherein the current sampling circuit further comprises:

a plurality of sampling resistors, each of the plurality of sampling resistors comprises a first terminal and a second terminal, wherein the first terminal of each of the plurality of sampling resistors is configured to receive a current flowing through the corresponding one of the plurality of switching circuits, the second terminal of each of the plurality of sampling resistors is coupled to a bias voltage, and the first terminal of each of the plurality of sampling resistors is further configured to output a corresponding one of the plurality of current sampling signals.

4. The controller of claim 1, wherein the filter circuit further comprises a low-pass filter, the low-pass filter is configured to dispel high frequency for the plurality of current sampling signals.

5. The controller of claim 1, wherein the reference voltage generation circuit further comprises:
a plurality of adders, wherein each of the plurality of adders is configured to add the corresponding one of the plurality of filtering signals and the ripple threshold signal to generate a corresponding one of the plurality of first reference signals; and
a plurality of subtractors, wherein each of the plurality of subtractors is configured to subtract the ripple threshold signal from the corresponding one of the plurality of filtering signals to generate a corresponding one of the plurality of second reference signals.

6. The controller of claim 1, wherein the fault signal generation circuit further comprises:
a plurality of first comparators, wherein each of the plurality of first comparators comprises a non-inverting input terminal, an inverting input terminal, and an output terminal, wherein the non-inverting input terminal of each of the plurality of first comparators is configured to receive a corresponding one of the corresponding plurality of current sampling signals, the inverting input terminal of each of the plurality of first comparators is configured to receive a corresponding one of the plurality of first reference signals, and the output terminal of each of the plurality of first comparators is configured to provide a corresponding first comparison signal via comparing the corresponding one of the corresponding plurality of current sampling signals with the corresponding one of the plurality of first reference signals; and
a plurality of second comparators, wherein each of the plurality of second comparators comprises a non-inverting input terminal, an inverting input terminal, and an output terminal, wherein the non-inverting input terminal of each of the plurality of second comparators is configured to receive a corresponding one of the plurality of second reference signals, the inverting input terminal of each of the plurality of second comparators is configured to receive a corresponding one of the corresponding plurality of current sampling signals, and the output terminal of each of the plurality of second comparators is configured to provide a corresponding second comparison signal via comparing the corresponding one of the plurality of second reference signals with the corresponding one of the corresponding plurality of current sampling signals.

7. The controller of claim 6, wherein the fault signal generation circuit further comprises:
a plurality of OR gates, wherein each of the plurality of OR gates comprises a first input terminal, a second input terminal, and an output terminal, wherein the first input terminal of each of the plurality of OR gates is configured to receive the corresponding first comparison signal, the second input terminal of each of the plurality of OR gates is configured to receive the corresponding second comparison signal, and the output terminal of each of the plurality of the OR gates is configured to provide a corresponding one of the plurality of fault signals.

8. The controller of claim 6, wherein the fault signal generation circuit further comprises:
a plurality of adders, wherein each of the plurality of adders is configured to sum the corresponding first comparison signal and the corresponding second comparison signal to generate a corresponding one of the plurality of fault signals.

9. A controller for a multi-phase converter, wherein the multi-phase converter comprises a plurality of switching circuits coupled in parallel, the controller comprises:
a current sampling circuit, configured to generate a plurality of current sampling signals, wherein each of the plurality of current sampling signals represents an associated current flowing through a corresponding one of the plurality of switching circuits;
a reference voltage generation circuit, configured to generate a first reference signal and a second reference signal based on a predetermined reference signal and a ripple threshold signal, wherein the first reference signal is equal to a sum of the predetermined reference signal and the ripple threshold signal, and the second reference signal is equal to a difference between the predetermined reference signal and the ripple threshold signal;
a fault signal generation circuit, configured to generate a plurality of fault signals based on the plurality of current sampling signals, the first reference signal and the second reference signal; and
a control circuit, coupled to the fault signal generation circuit to receive the plurality of fault signals, and configured to adjust a plurality of control signals based on the plurality of fault signals to control the plurality of switching circuits respectively.

10. The controller of claim 9, wherein when one of the plurality of current sampling signals is between the first reference signal and the second reference signal, a corresponding one of the plurality of fault signals is configured to be a first state, and when the corresponding one of the plurality of fault signals remains the first state for more than a predetermined time period, a corresponding one of the plurality of control signals is configured to turn off a corresponding one of the plurality of switching circuits.

11. The controller of claim 9, wherein the reference voltage generation circuit further comprises:
an adder, comprising a first input terminal, a second input terminal, and an output terminal, wherein the first input terminal of the adder is configured to receive the predetermined reference signal, the second input terminal of the adder is configured to receive the ripple threshold signal, and the output terminal of the adder is configured to provide the first reference signal via summing the predetermined reference signal and the ripple threshold signal; and
a subtractor, comprising a first input terminal, a second input terminal, and an output terminal, the first input terminal of the subtractor is configured to receive the predetermined reference signal, the second input terminal of the subtractor is configured to receive the ripple threshold signal, and the output terminal of the subtractor is configured to provide the second reference signal via subtracting the ripple threshold signal from the predetermined reference signal.

12. The controller of claim 9, wherein the fault signal generation circuit further comprises:
   a plurality of first comparators, wherein each of the plurality of first comparators comprises a non-inverting input terminal, an inverting input terminal, and an output terminal, wherein the non-inverting input terminal of each of the plurality of first comparators is configured to receive a corresponding one of the plurality of current sampling signals, the inverting input terminal of each of the plurality of first comparators is configured to receive the first reference signal, and the output terminal of each of the plurality of first comparators is configured to provide a corresponding first comparison signal via comparing the corresponding one of the plurality of current sampling signals with the first reference signal; and
   a plurality of second comparators, wherein each of the plurality of second comparators comprises a non-inverting input terminal, an inverting input terminal, and an output terminal, wherein the non-inverting input terminal of each of the plurality of second comparators is configured to receive the second reference signal, the inverting input terminal of each of the plurality of second comparators is configured to receive the corresponding one of the corresponding plurality of current sampling signal, and the output terminal of each of the plurality of second comparators is configured to provide a corresponding second comparison signal via comparing the second reference signal with the corresponding one of the plurality of current sampling signals.

13. The controller of claim 12, wherein the fault signal generation circuit further comprises:
   a plurality of adders, wherein each of the plurality of adders comprises a first input terminal, a second input terminal, and an output terminal, wherein the first input terminal of each of the plurality of adders is configured to receive the corresponding first comparison signal, the second input terminal of each of the plurality of adders is configured to receive the corresponding second comparison signal, and the output terminal of each of the plurality of adders is configured to provide a corresponding one of the plurality of fault signals via summing the corresponding first comparison signal and the corresponding second comparison signal.

14. The controller of claim 12, wherein the fault signal generation circuit further comprises:
   a plurality of OR gates, wherein each of the plurality of OR gates comprises a first input terminal, a second input terminal, and an output terminal, the first input terminal of each of the plurality of OR gates is configured to receive the corresponding first comparison signal, the second input terminal of each of the plurality of OR gates is configured to receive the corresponding second comparison signal, and the output terminal of each of the plurality of OR gates is configured to provide a corresponding one of the plurality of fault signals.

15. The controller of claim 9, wherein the predetermined reference signal is configured to be equal to a corresponding one of the plurality of current sampling signals when the associated current flowing through a corresponding one of the plurality of switching circuits is zero.

16. A fault detection method for a multi-phase converter, wherein the multi-phase converter comprises a plurality of switching circuits coupled in parallel, the fault detection method comprising:
   generating a plurality of current sampling signals by sampling currents flowing through the plurality of switching circuits;
   generating a first reference signal and a second reference signal based on a predetermined reference signal and a ripple threshold signal;
   generating a plurality of fault signals based on comparison results of each of the plurality of current sampling signals with the first reference signal and the second reference signal; and
   adjusting control signals of the plurality of switching circuits based on the plurality of fault signals respectively; wherein
   when one of the plurality of current sampling signals is between the first reference signal and the second reference signal, a corresponding one of the plurality of fault signals is configured to be a first state, and when the corresponding one of the plurality of fault signals remains the first state for more than a predetermined time period, a corresponding one of the control signals is configured to turn off a corresponding one of the plurality of switching circuits.

17. The fault detection method of claim 16, wherein the first reference signal is equal to a sum of the predetermined reference signal and the ripple threshold signal, and the second reference signal is equal to a difference between the predetermined reference signal and the ripple threshold signal.

18. The fault detection method of claim 16, wherein generating the plurality of fault signals based on the comparison results of each of the plurality of current sampling signals with the first reference signal and the second reference signal further comprises:
   generating a plurality of first comparison signals based on the comparison results of each of the plurality of current sampling signals with the first reference signal; and
   generating a plurality of second comparison signals based on the comparison results of each of the plurality of current sampling signals with the second reference signal; wherein
   when one of the plurality of first comparison signals or one of the plurality of second comparison signals is a first state, a corresponding one of the plurality of fault signals is configured to be the first state.

* * * * *